(12) United States Patent
Cheng et al.

(10) Patent No.: US 11,537,053 B2
(45) Date of Patent: Dec. 27, 2022

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Chiao-Hua Cheng, Tainan (TW);
Yu-Kuang Sun, Hsinchu (TW);
Wei-Shin Cheng, Hsinchu (TW);
Yu-Huan Chen, Hsinchu (TW);
Ming-Hsun Tsai, Hsinchu (TW);
Cheng-Hao Lai, Taichung (TW);
Cheng-Hsuan Wu, New Taipei (TW);
Yu-Fa Lo, Kaohsiung (TW);
Shang-Chieh Chien, New Taipei (TW);
Heng-Hsin Liu, New Taipei (TW);
Li-Jui Chen, Hsinchu (TW);
Sheng-Kang Yu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/450,100

(22) Filed: Oct. 6, 2021

(65) Prior Publication Data
US 2022/0365442 A1    Nov. 17, 2022

Related U.S. Application Data

(60) Provisional application No. 63/201,822, filed on May 14, 2021.

(51) Int. Cl.
*G03F 7/20* (2006.01)
*H05G 2/00* (2006.01)

(52) U.S. Cl.
CPC ........ *G03F 7/7085* (2013.01); *G03F 7/70033* (2013.01); *G03F 7/70533* (2013.01); *G03F 7/70916* (2013.01); *H05G 2/006* (2013.01)

(58) Field of Classification Search
CPC .............. G03F 7/7085; G03F 7/70033; G03F 7/70916; G03F 7/70; G03F 7/70008;
(Continued)

(56) References Cited

U.S. PATENT DOCUMENTS

| | | | | |
|---|---|---|---|---|
| 6,232,613 B1 * | 5/2001 | Silfvast | .................. | H05G 2/003 250/493.1 |
| 2006/0001692 A1 * | 1/2006 | Mori | .................... | B41J 2/04558 347/19 |

(Continued)

*Primary Examiner* — Christina A Riddle
(74) *Attorney, Agent, or Firm* — Harrity & Harrity, LLP

(57) ABSTRACT

Some implementations herein include a detection circuit and a fast and accurate in-line method for detecting blockage on a droplet generator head of an extreme ultraviolet exposure tool without impacting the flow of droplets of a target material through the droplet generator head. In some implementations described herein, the detection circuit includes a switch circuit that is configured in an open configuration, in which the switch is electrically open between two electrode elements. When an accumulation of the target material occurs across two or more electrode elements on the droplet generator head, the accumulation functions as a switch that closes the detection circuit. A controller may detect closure of the detection circuit.

20 Claims, 14 Drawing Sheets

(58) Field of Classification Search
CPC ..... G03F 7/70483–70541; G03F 7/708; G03F 7/70841; G03F 7/70858; G03F 7/709; G03F 7/70908–70941; G03F 7/7095; G03F 7/70975; G03F 7/70991; H05G 2/00–008
USPC ..... 355/30, 52–55, 67–77; 250/492.1, 492.2, 250/492.22, 492.23, 493.1, 494.1, 503.1, 250/504 r, 505.1; 356/237.1–237.6
See application file for complete search history.

(56) References Cited

U.S. PATENT DOCUMENTS

| | | | |
|---|---|---|---|
| 2010/0213272 A1* | 8/2010 | Yabu | H05G 2/003 239/102.1 |
| 2011/0310365 A1* | 12/2011 | Yabu | H05G 2/008 355/30 |
| 2014/0042653 A1* | 2/2014 | Ueno | H05G 2/006 264/13 |
| 2015/0002830 A1* | 1/2015 | Schimmel | G03F 7/70033 355/67 |
| 2019/0104604 A1* | 4/2019 | Chien | G03F 7/70958 |
| 2021/0033981 A1* | 2/2021 | Takashima | H05G 2/005 |

* cited by examiner

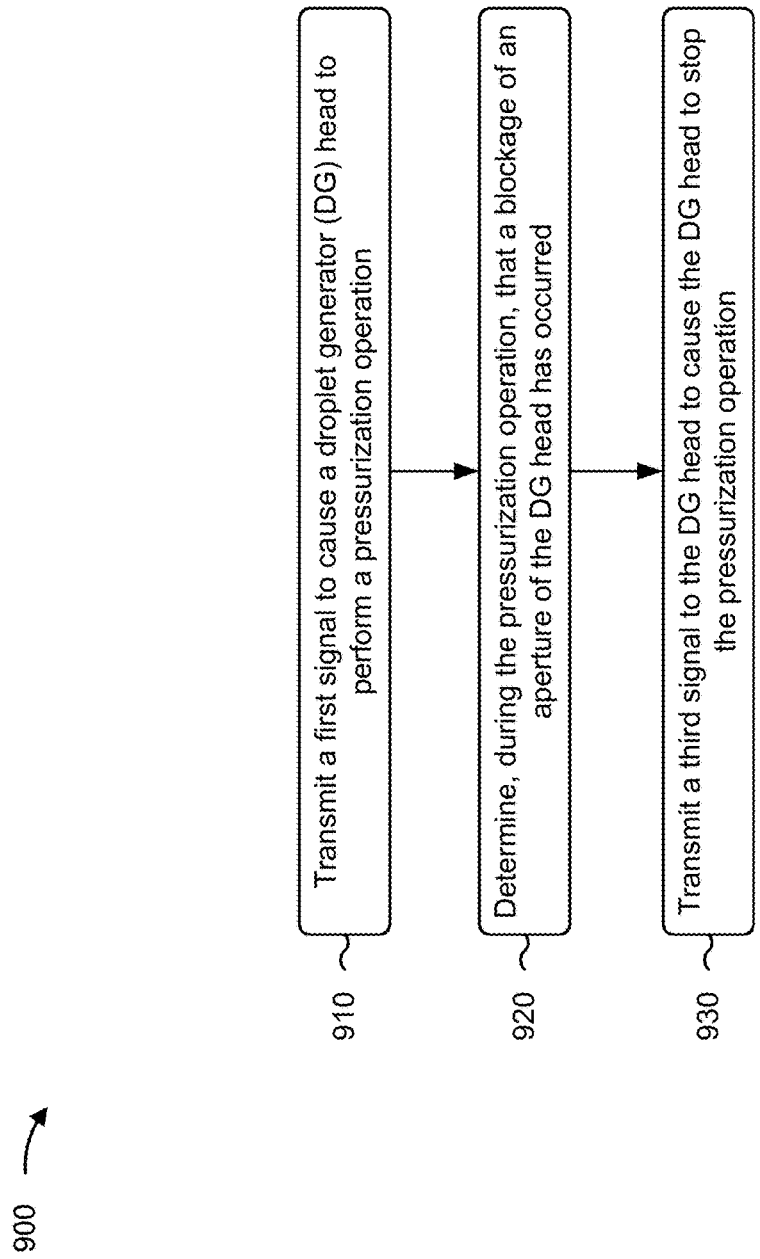

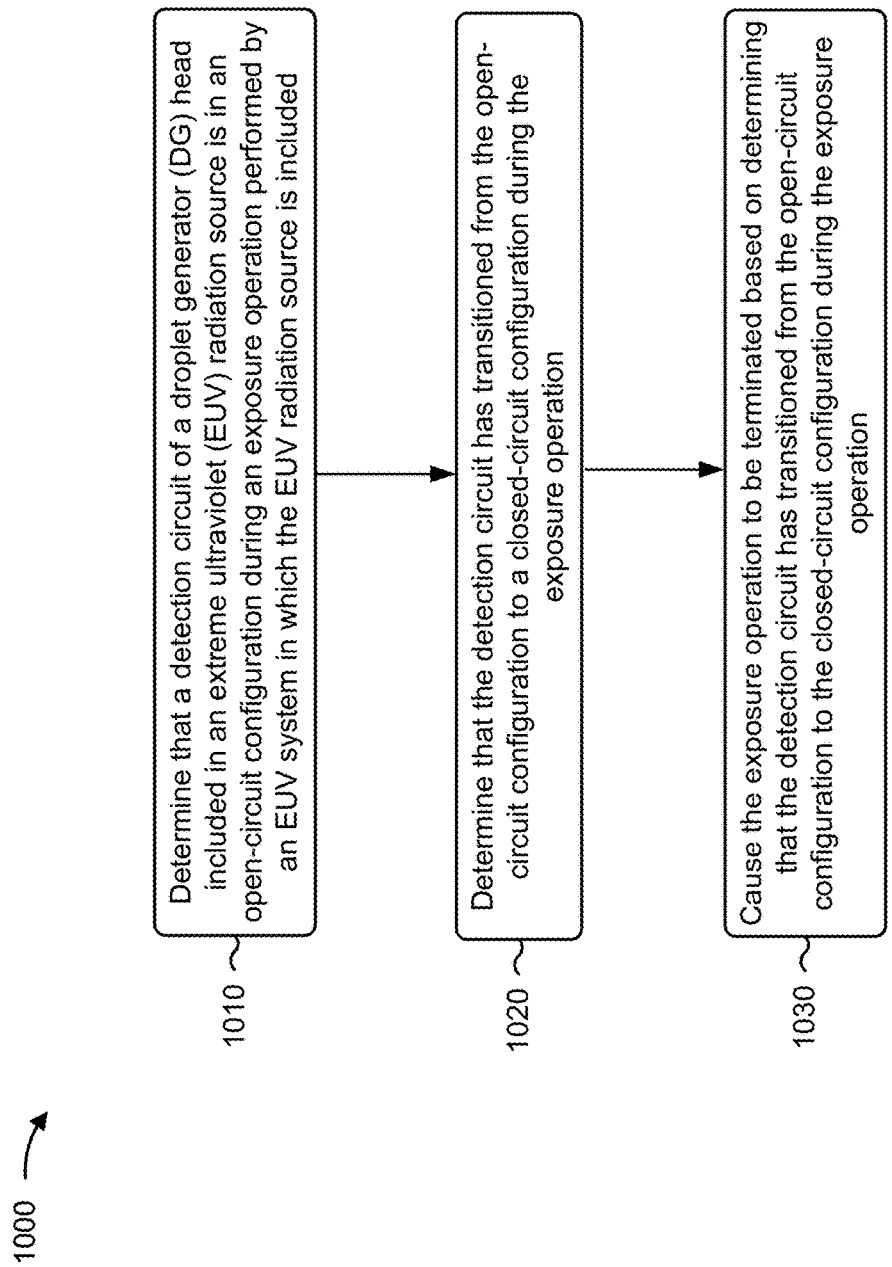

SEMICONDUCTOR PROCESSING TOOL AND METHODS OF OPERATION

CROSS-REFERENCE TO RELATED APPLICATION

This Patent Application claims priority to U.S. Provisional Patent Application No. 63/201,822, filed on May 14, 2021, and entitled "SEMICONDUCTOR PROCESSING TOOL AND METHODS OF OPERATION". The disclosure of the prior Application is considered part of and is incorporated by reference into this Patent Application.

BACKGROUND

An exposure tool is a semiconductor processing tool that is capable of exposing a photoresist layer to a radiation source, such as an ultraviolet light (UV) source (e.g., a deep UV light source, an extreme UV (EUV) light source, and/or the like), an x-ray source, an electron beam source, and/or another type of radiation source. Examples of exposure tools include an EUV exposure tool or an immersion exposure tool, among other examples. An exposure tool may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. An exposure tool may include a scanner, a stepper, or a similar type of exposure tool.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9 and 10 are flowcharts of example processes relating to operation of the detection circuit described herein.

DETAILED DESCRIPTION

Figure 1:
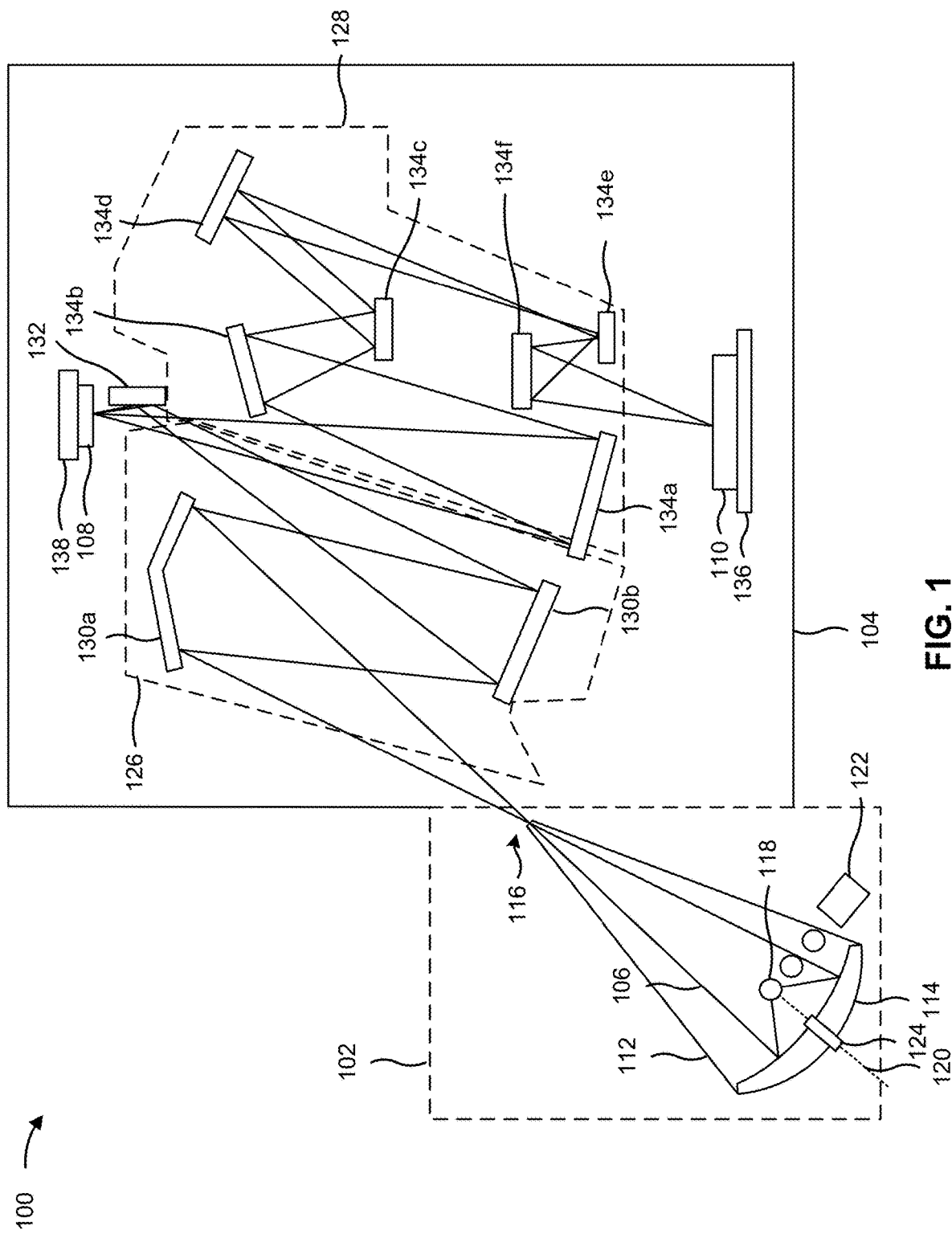
FIG. 1 is a diagram of an example lithography system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below, " "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An exposure tool, such as an EUV exposure tool, may include a droplet generator (DG) head that is configured to generate droplets of a target material such as tin (Sn), among other examples. The droplets are subjected to a beam of energy (e.g., light), which causes the formation of a plasma. The plasma releases energy in the form of EUV light, which is used to pattern photoresist layers on semiconductor substrates as part of semiconductor device fabrication. In some cases, a pressurization failure may occur for the DG head during re-pressurization of the DG head. As an example, the accumulation of tin on the DG head can cause the DG head to become clogged with the tin, which may result in a pressurization failure.

In some cases, troubleshooting may be performed for the EUV exposure tool to determine the source of a pressurization failure of the DG head, including reviewing software logs and performing a step-by-step evaluation to check the functionality of one or more parts of the EUV exposure tool for proper function. However, these troubleshooting techniques may be time consuming and complex, which negatively impacts quality of troubleshooting (e.g., decreases quality of troubleshooting) and downtime (e.g., increases downtime) of the EUV exposure tool. This negative impact can decrease productivity of the EUV exposure tool and decrease semiconductor processing yield and throughput of the EUV exposure tool.

Some implementations described herein include a detection circuit and a fast and accurate in-line method for detecting a blockage on a DG head of an EUV exposure tool without impacting the flow of droplets of a target material through the DG head. In some implementations described herein, the detection circuit includes a switch circuit that is configured in an open configuration, in which the switch is electrically open between two electrode elements. When an accumulation (e.g., build-up) of an amount of the target material occurs across two or more electrode elements on the DG head, the accumulation functions as a switch that closes the detection circuit. A controller may detect closure of the detection circuit and may cause one or more automated actions described herein to be performed based on the detection.

In this way, the blockage (e.g., the accumulation or build-up that causes a pressurization failure) on the DG head can be quickly identified and resolved, which improves troubleshooting quality and reduces downtime of the EUV exposure tool. This increases the productivity of the EUV exposure tool and increases semiconductor processing yield and throughput of the EUV exposure tool.

FIG. 1 is a diagram of an example of a lithography system 100 described herein. The lithography system 100 includes an extreme ultraviolet (EUV) lithography system or another type of lithography system that is configured to transfer a pattern to a semiconductor substrate using mirror-based optics. The lithography system 100 may be configured for use in a semiconductor processing environment such as a semiconductor foundry or a semiconductor fabrication facility.

As shown in FIG. 1, the lithography system 100 includes a radiation source 102 and an exposure tool 104. The radiation source 102 (e.g., an EUV radiation source or another type of radiation source) is configured to generate radiation 106 such as EUV radiation and/or another type of electromagnetic radiation (e.g., light). The exposure tool 104 (e.g., an EUV scanner or another type of exposure tool) is configured to focus the radiation 106 onto a reflective reticle 108 (or a photomask) such that a pattern is transferred from the reticle 108 onto a semiconductor substrate 110 using the radiation 106.

The radiation source 102 includes a vessel 112 and a collector 114 in the vessel 112. The collector 114, includes a curved mirror that is configured to collect the radiation 106 generated by the radiation source 102 and to focus the radiation 106 toward an intermediate focus 116. The radiation 106 is produced from a plasma that is generated from droplets 118 of a target material (e.g., a target material including Sn droplets or another type of droplets) being exposed to a laser beam 120. The droplets 118 are provided across the front of the collector 114 by a droplet generator (DG) head 122. The DG head 122 is pressurized to provide a fine and controlled output of the droplets 118.

A laser source, such as a pulse carbon dioxide ($CO_2$) laser, generates the laser beam 120. The laser beam 120 is provided (e.g., by a beam delivery system to a focus lens) such that the laser beam 120 is focused through a window 124 of the collector 114. The laser beam 120 is focused onto the droplets 118 which generates the plasma. The plasma produces a plasma emission, some of which is the radiation 106. The laser beam 120 is pulsed at a timing that is synchronized with the flow of the droplets 118 from the DG head 122.

The exposure tool 104 includes an illuminator 126 and a projection optics box (POB) 128. The illuminator 126 includes a plurality of reflective mirrors that are configured to focus and/or direct the radiation 106 onto the reticle 108 so as to illuminate the pattern on the reticle 108. The plurality of mirrors includes, for example, a mirror 130a and a mirror 130b. The mirror 130a includes a field facet mirror (FFM) or another type of mirror that includes a plurality of field facets. The mirror 130b includes a pupil facet mirror (PFM) or another type of mirror that also includes a plurality of pupil facets. The facets of the mirrors 130a and 130b are arranged to focus, polarize, and/or otherwise tune the radiation 106 from the radiation source 102 to increase the uniformity of the radiation 106 and/or to increase particular types of radiation components (e.g., transverse electric (TE) polarized radiation, transverse magnetic (TM) polarized radiation). Another mirror 132 (e.g., a relay mirror) is included to direct radiation 106 from the illuminator 126 onto the reticle 108.

The projection optics box 128 includes a plurality of mirrors that are configured to project the radiation 106 onto the semiconductor substrate 110 after the radiation 106 is modified based on the pattern of the reticle 108. The plurality of reflective mirrors includes, for example, mirrors 134a-134f. In some implementations, the mirrors 134a-134f are configured to focus or reduce the radiation 106 into an exposure field, which may include one or more die areas on the semiconductor substrate 110.

The exposure tool 104 includes a substrate stage 136 (e.g., a wafer stage) configured to support the semiconductor substrate 110. Moreover, the substrate stage 136 is configured to move (or step) the semiconductor substrate 110 through a plurality of exposure fields as the radiation 106 transfers the pattern from the reticle 108 onto the semiconductor substrate 110. The exposure tool 104 also includes a reticle stage 138 that configured to support and/or secure the reticle 108. Moreover, the reticle stage 138 is configured to move or slide the reticle through the radiation 106 such that the reticle 108 is scanned by the radiation 106. In this way, a pattern that is larger than the field or beam of the radiation 106 may be transferred to the semiconductor substrate 110.

In an example exposure operation (e.g., an EUV exposure operation), the DG head 122 provides the stream of the droplets 118 across the front of the collector 114. The laser beam 120 contacts the droplets 118, which causes a plasma to be generated. The plasma emits or produces the radiation 106 (e.g., EUV light). The radiation 106 is collected by the collector 114 and directed out of the vessel 112 and into the exposure tool 104 toward the mirror 130a of the illuminator 126. The mirror 130a reflects the radiation 106 onto the mirror 130b, which reflects the radiation 106 onto the mirror 132 toward the reticle 108. The radiation 106 is modified by the pattern in the reticle 108. In other words, the radiation 106 reflects off of the reticle 108 based on the pattern of the reticle 108. The reflective reticle 108 directs the radiation 106 toward the mirror 134a in the projection optics box 128, which reflects the radiation 106 onto the mirror 134b. The radiation 106 continues to be reflected and reduced in the projection optics box 128 by the mirrors 134c-134f. The mirror 134f reflects the radiation 106 onto the semiconductor substrate 110 such that the pattern of the reticle 108 is transferred to the semiconductor substrate 110. The above-described exposure operation is an example, and the lithography system 100 may operate according to other EUV techniques and radiation paths that include a greater quantity of mirrors, a lesser quantity of mirrors, and/or a different configuration of mirrors.

As indicated above, FIG. 1 is provided as an example. Other examples may differ from what is described with regard to FIG. 1. For example, another example may include additional components, fewer components, different components, or differently arranged components than those shown in FIG. 1. Additionally, or alternatively, a set of components (e.g., one or more components) of FIG. 1 may perform one or more functions described herein as being performed by another set of components.

Figure 2:
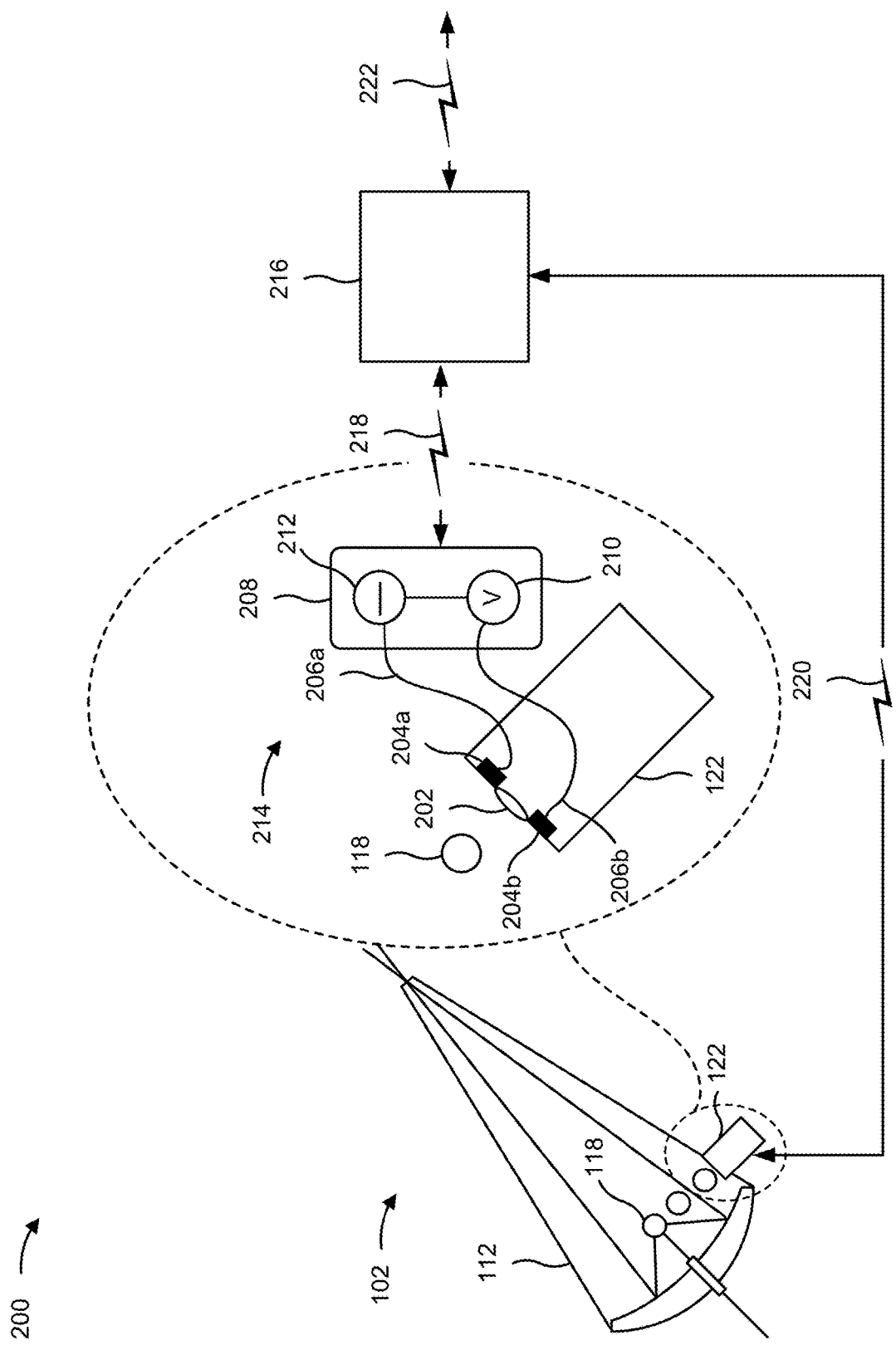
FIG. 2 is a diagram of an example droplet generator head and a detection circuit described herein.

FIG. 2 is a diagram 200 of the example DG head 122 and a detection circuit described herein. As shown in FIG. 2, the DG head 122 and the detection circuit may be included in the radiation source 102 of the lithography system 100 of FIG. 1. The detection circuit may be used to quickly and accurately detect operational issues with the DG head 122, such as a blockage or obstruction of the DG head 122 which may be caused by a build-up of tin (or another target material) in and/or on the DG head 122.

The DG head 122 includes an aperture 202 through which the droplets 118 (e.g., droplets of a target material such as Sn droplets, among other examples) are ejected, dispensed, and/or otherwise provided into the vessel 112. Although illustrated as round in shape, the aperture 202 may be square in shape, rectangular in shape, a slit shape, or another shape.

A plurality of electrode elements (e.g., electrode element 204a, electrode element 204b) are distributed around and/or along a perimeter of the aperture 202. At least one of the plurality electrode elements may include a metal film material (e.g., a copper (Cu) metal film material, a gold (Au) metal film material, an aluminum (Al) metal film material, and/or another type of metal film material). A connector 206a (e.g., a Cu wire, an Au wire, an Al wire) electrically connects the electrode element 204a to a signal generator 208, while another connector 206b (e.g., another Cu wire, another Au wire, another Al wire) electrically connects the electrode element 204b to the signal generator 208. Alternatively, the connectors 206a and 206b may be implemented as conductive traces on a circuit board (e.g., a printed circuit board (PCB)) or as metallization lines in an integrated circuit (IC), among other examples. In general, the signal generator 208 may include a load source 210 (e.g., a voltage source, a current source, or another type of electrical source) and a load detector 212 (e.g., voltage detection circuitry, current detection circuitry, or another type of electrical source detection circuitry). The combination of the electrode elements 204a and 204b, the connectors 206a and 206b, and the signal generator 208 (including the load source 210 and the load detector 212) may be referred to as a detection circuit 214.

The signal generator 208 may be configured to communicate with a controller 216 (e.g., a DG head controller) using a communication link 218. In some implementations, the signal generator 208, using the communication link 218, transmits a signal to the controller 216 that indicates a blockage of the aperture 202.

The controller 216 may include a combination of integrated circuitry such as logic circuitry, memory circuitry, and/or communication circuitry. In some instances, memory circuitry of the controller 216 may store code that is executable by logic circuitry of the controller 216 to perform operations described in greater detail below. Furthermore, the controller 216 may be configured to provide one or more signals to the DG head 122 such as a voltage, a current, a digital communication, and/or another type of electrical/electronic signal.

In some implementations, the controller 216 transmits, using the communication link 220, a signal that causes the DG head 122 to perform an operation. Examples of such an operation include the DG head 122 initiating a pressurization operation, the DG head 122 stopping a pressurization operation, and/or the DG head 122 performing a self-cleaning operation (e.g., DG head 122 activating a convection, radiation, or conduction heat-transfer mechanism to liquify or melt a blockage caused by an accumulation of a target material), among other examples.

The controller 216 may also communicate with other components of a lithography system (e.g., the lithography system 100) using a communication link 222. For example, and using the communication link 222, the controller 216 may transmit a maintenance log file that includes information associated with the self-cleaning operation described above. As another example, the controller 216 may, using the communication link 222, transmit a signal that causes the lithography system to output an indication of a blockage of the aperture 202 (e.g., an audible output through a speaker of the lithography system or a visual output through an indicator light of the lithography system).

In some implementations, the controller 216 includes wireless communication hardware, such as a wireless transmitter or a wireless transceiver. In such implementations, at least one of the communication links 218, 220, or 222 may be a wireless-communication link. In some implementations, the controller 216 includes wired communication hardware, such as a transmitter or a transceiver configured for wired communications. In such implementations, at least one of the communication links 218, 220, or 222 may be a wired-communication link.

As indicated above, FIG. 2 is provided as an example. Other examples may differ from what is described with regard to FIG. 2. For example, another example may include additional components, fewer components, different components, or differently arranged components than those shown in FIG. 2. Additionally, or alternatively, a set of components (e.g., one or more components) of FIG. 2 may perform one or more functions described herein as being performed by another set of components.

Figure 3A:
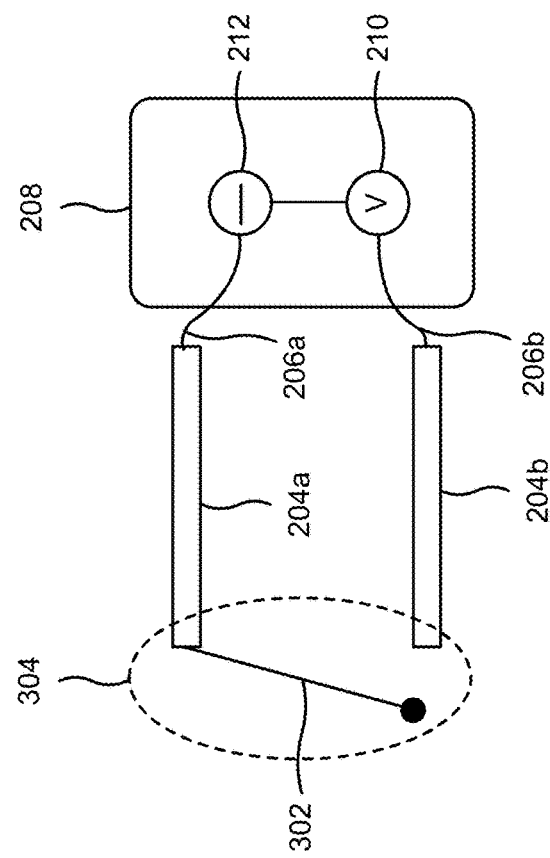
FIGS. 3A-3B are diagrams of example circuit configurations described herein.
Figure 3B:
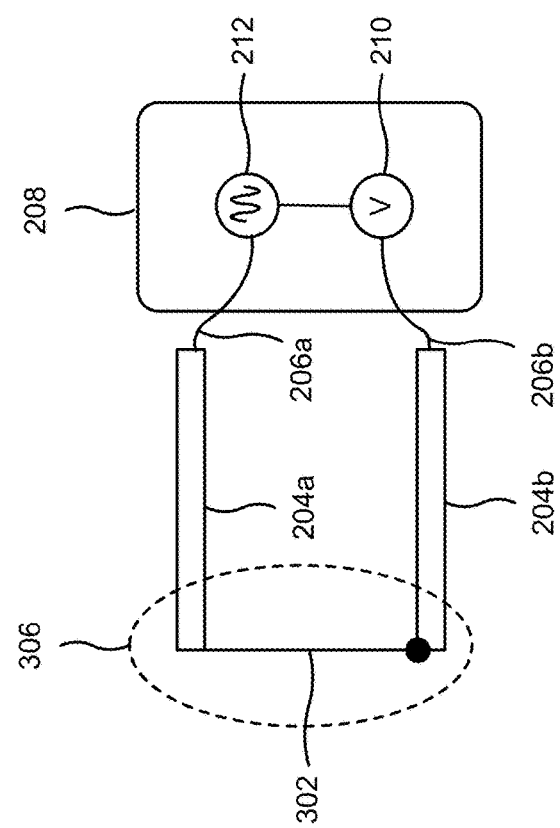

FIGS. 3A and 3B are diagrams of example circuit configurations 300 described herein of the detection circuit 214 (e.g., the electrode elements 204a and 204b, the connectors 206a and 206b, and the signal generator 208 including the load source 210 and the load detector 212) of FIG. 2. FIG. 3A illustrates an open-circuit configuration and FIG. 3B illustrates a closed-circuit configuration. In some implementations, a configuration corresponds to an absence of a blockage condition at the aperture 202, while in other implementations, a configuration corresponds to a presence of an Sn-blockage at the aperture 202.

As shown in FIG. 3A, the electrode element 204a and the electrode element 204b are not connected by a switch 302 (e.g., not connected by an accumulation of Sn at the aperture 202). In other words, the switch 302 is open in FIG. 3A, which provides an open circuit between the electrode element 204a and the electrode element 204b. As the electrode element 204a and the electrode element 204b are not connected (e.g., are not electrically connected by the switch 302), the load detector 212 does not detect an output that is generated by the load source 210. In other words, the voltage, the current, or another type of output of the load source 210 is blocked from propagating between the electrode element 204a and the electrode element 204b. Thus, the output from the load source 210 is blocked from being provided to the load detector 212. In such a configuration, the signal generator 208 is in a deactivated mode in which the signal generator 208 refrains from transmitting a signal (e.g., transmitting a signal to the controller 216) and the load source 210 does not generate an indication that would otherwise indicate an Sn-blockage at the aperture 202. In general, FIG. 3A illustrates an open-circuit configuration 304 that corresponds to an absence of an Sn-blockage at the aperture 202.

In FIG. 3B, the electrode element 204a and the electrode element 204b are connected by the switch 302 (e.g., connected by an accumulation of Sn at the aperture 202). The switch 302 permits the output provided by the load detector 212 to propagate from the electrode element 204a to the electrode element 204b across the switch 302, which in turn permits the output to propagate to the load detector 212. As the electrode element 204a and the electrode element 204b are connected (e.g., electrically connected), the load detector 212 detects the output that is generated by the load source 210. In general, FIG. 3B illustrates a closed-circuit configuration 306 that corresponds to an Sn-blockage at the aperture 202. In FIG. 3B, the Sn-blockage conceptually corresponds to the switch 302.

As indicated above, FIGS. 3A and 3B are provided as examples. Other examples may differ from what is described with regard to FIGS. 3A and 3B.

Figure 4A:
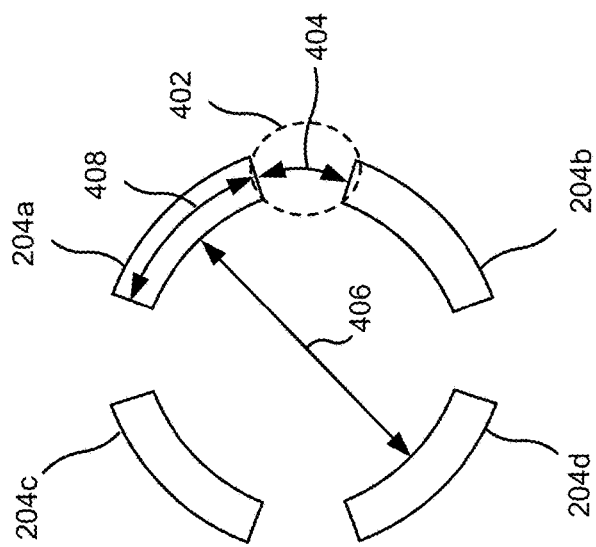
FIGS. 4A-4B are diagrams of example implementations of a plurality electrode elements described herein.
Figure 4B:
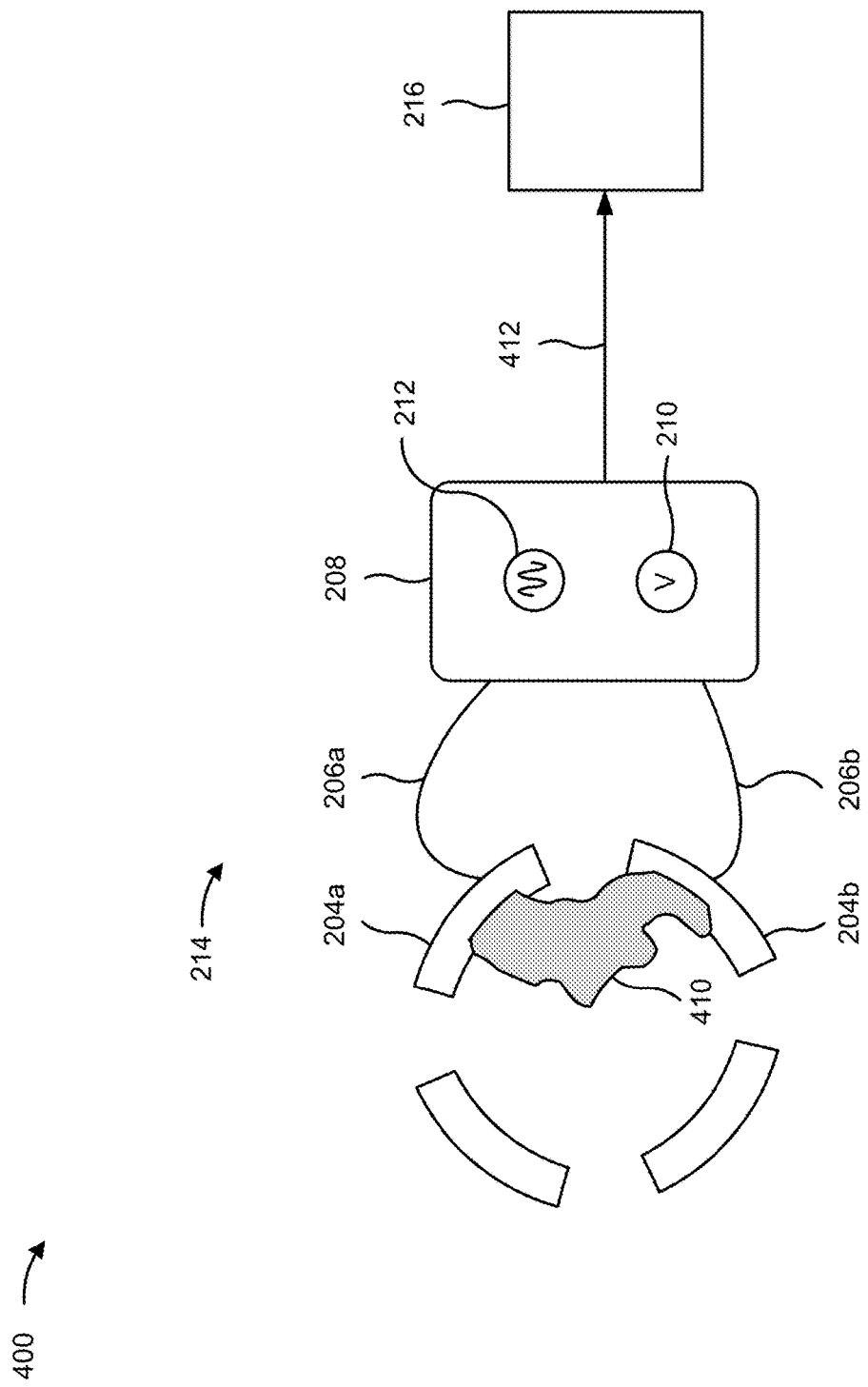

FIG. 4A and FIG. 4B are diagrams of example implementations 400 of a plurality of electrode elements described herein. In addition to the electrode elements 204a and 204b described above, the plurality of electrode elements illustrated in FIG. 4A and FIG. 4B include additional electrode elements 204c and 204d.

A quantity of the plurality of electrode elements may vary based on factors such as a size of the aperture 202 or a shape of the aperture 202. As an example, the plurality of electrode elements may include a quantity of two to eight electrode elements. However, other quantities of electrode elements are within the scope of the present disclosure. The quantity of the plurality of electrode elements can impact a sensitivity of the detection circuit 214 and also impact complexity and cost of the detection circuit 214. In some implementations, one or more of the plurality of electrode elements include a metal film material (e.g., Cu, Au, Al, among other examples) because the conductive material facilitates detection of an open-circuit configuration (e.g., open-circuit configuration 304) and/or a closed-circuit configuration (e.g., closed-circuit configuration 306).

Furthermore, in some implementations, a shape of at least one of the plurality of electrode elements conforms to a shape of the aperture 202. For example, and as shown in FIG. 4A, the shape of the electrode element 204a is an arc segment that conforms to a circular perimeter (e.g., shape) of the aperture 202. As another example, a shape of an electrode element may be a rectangular if the aperture 202 is shaped as a rectangle, a slit, and so on.

A distribution (e.g., locations) of the plurality of electrode elements with respect to the aperture 202 may, in some implementations, be symmetric. In some implementations, the distribution may be non-symmetric (e.g., to compensate for an effect of gravitational forces or flow effects associated with accumulation of a target material), a perimeter region of the aperture 202 that collects a substantial amount of the target material may include four to six electrode elements, while another perimeter region of the aperture 202 that collects a lesser amount of the target material may include one or two electrode elements.

FIG. 4A illustrates example aspects that may be associated with the plurality of electrode elements distributed around a perimeter of a circular aperture (e.g., the aperture 202). As illustrated, a region 402 defining a gap between respective ends of a pair of adjacent electrode elements (e.g., the region 402 between an end of the electrode element 204a and an end of the electrode element 204b) electrically isolates the pair of adjacent electrode elements. In other words, ends of the plurality of adjacent electrode elements may be separated by regions that electrically isolate respective pairs of the plurality of electrode elements.

In some implementations, a length 404 of the region 402 defining the gap between respective adjacent ends of the pair of electrode elements is in a range of approximately 1 millimeter to approximately 5 millimeters. The range of the length 404 may impact the detection of Sn accumulation (e.g., build-up) and also impact sensitivity of a detection circuit (e.g., the detection circuit 214). For example, if the length 404 is less than approximately 1 millimeter, an amount of Sn accumulation, which does not impact operation of the DG head 122, may bridge the pair of adjacent electrode elements and lead to a false-positive condition, lead to excessive or unrequired cleaning of the DG head 122, and so on. Conversely, if the length 404 is greater than approximately 5 millimeters, an amount of Sn accumulation, which impacts operation of the DG head 122, may not bridge the pair of electrode elements and lead to a failure condition where the DG head 122 is clogged or stops functioning. However, other values for the length 404 are within the scope of the present disclosure.

Also illustrated in FIG. 4A is an example diameter 406 between opposing electrode elements of the plurality of electrode elements (e.g., the electrode element 204a and the electrode element 204d across the aperture 202). In some implementations, the diameter 406 may be in a range of approximately 5 millimeters to approximately 7 millimeters. The range of the diameter 406 may impact operation of the radiation source 102 in several aspects, including blocking droplets (e.g., the droplets 118) from exiting the aperture (e.g., the aperture 202) if the diameter 406 is less than approximately 5 millimeters. If the diameter 406 is greater than approximately 7 millimeters achieving a closed-circuit configuration (e.g., the closed-circuit configuration 306) may require an excessive amount of Sn accumulation (which may result in Sn-blockage being undetected for a duration of time). Furthermore, if the diameter 406 is greater than approximately 7 millimeters, a pressurization characteristic of a vessel (e.g., the vessel 112) may be impacted. For example, a pressure level within the vessel may not be maintainable if the diameter is greater than approximately 7 millimeters. However, other values for the diameter 406 are within the scope of the present disclosure.

FIG. 4A also illustrates an example length 408 of an electrode element (e.g. the electrode element 204a). The length 408 may be in a range of approximately 1 millimeter to approximately 5 millimeters. The length 408 may impact surface area for the electrode element 204a to accumulate Sn build-up and impact sensitivity of a detection circuit (e.g., the detection circuit 214). For example, if the length 408 is less than approximately 1 millimeter, an available surface area of the electrode element 204a may be insufficient to gather a detectable amount of Sn and an amount of Sn accumulation, which impacts operation of the DG head 122, may not bridge the region 402. Conversely, if the length 408 is greater than approximately 5 millimeters, an amount of Sn accumulation, which does not impact operation of the DG head 122, may bridge the region 402 and lead to a false-positive condition, lead to excessive or unrequired cleaning of the DG head 122, and so on. However, other values for the length 408 are within the scope of the present disclosure.

An example implementation of the detection circuit 214 includes electrode elements having a common shape and/or size. Such an implementation may save on manufacturing costs (e.g., save on tooling/die costs to stamp the electrode elements). Another example implementation of the detection circuit 214 includes electrode elements having different shapes and/or sizes. Such an implementation may improve performance of the detection circuit 214 (e.g., tune sensitivity of the detection circuit 214 to detect a particular profile or range of Sn accumulation about the aperture 202).

FIG. 4B illustrates a blockage 410 of an aperture (e.g., the aperture 202) detected by the detection circuit 214. The detection circuit 214 (e.g., the plurality of electrode elements 204a-204d around a perimeter of the aperture 202, the connectors 206a and 206b, and the signal generator 208) detects the blockage 410 of at least a portion of the aperture 202. The blockage 410 creates a conductive path that bridges a gap between the electrode element 204a and the electrode element 204b to electrically connect the electrode element 204a to the electrode element 204b. Thus, the blockage 410 functions as the switch 302 described above with respect to FIGS. 3A and 3B.

The connection of the electrode element 204a to the electrode element 204b causes the detection circuit 214 to be closed (e.g., the closed-circuit configuration 306). Based on the load detector 212 detecting that the detection circuit 214 is closed, the signal generator 208 may transmit a signal 412 to the controller 216 for further processing.

Additional connectors which may be present and part of the detection circuit 214 (e.g., connectors between electrode elements 204c and 204d to the signal generator 208) are omitted from FIG. 4B for simplicity.

As indicated above, FIGS. 4A and 4B are provided as an examples. Other examples may differ from what is described with regard to FIGS. 4A and 4B.

Figure 5A:
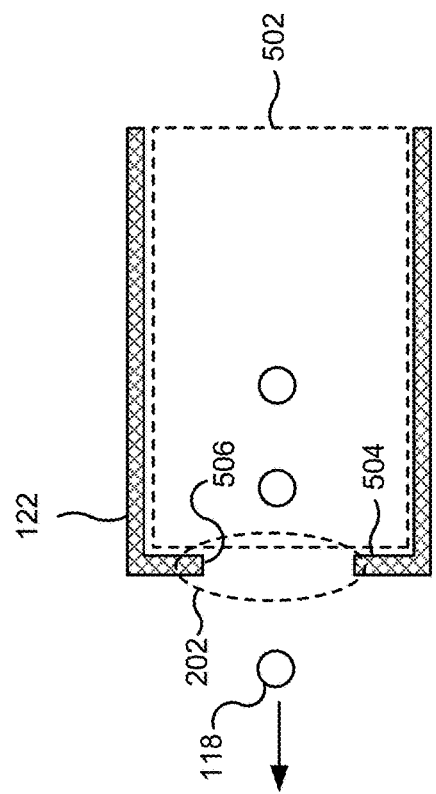
FIGS. 5A-5C are diagrams of example implementations described herein.
Figure 5B:
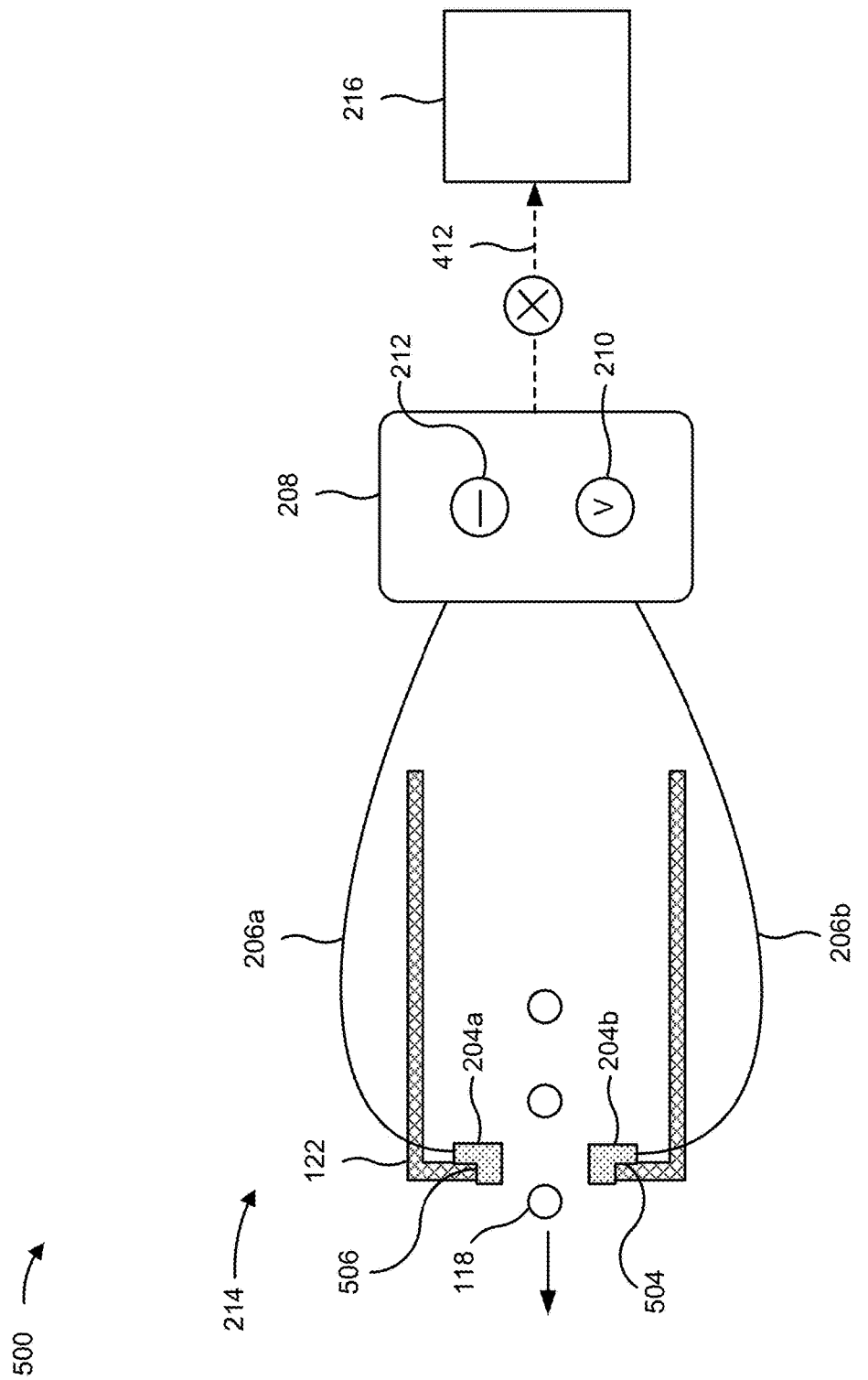
Figure 5C:
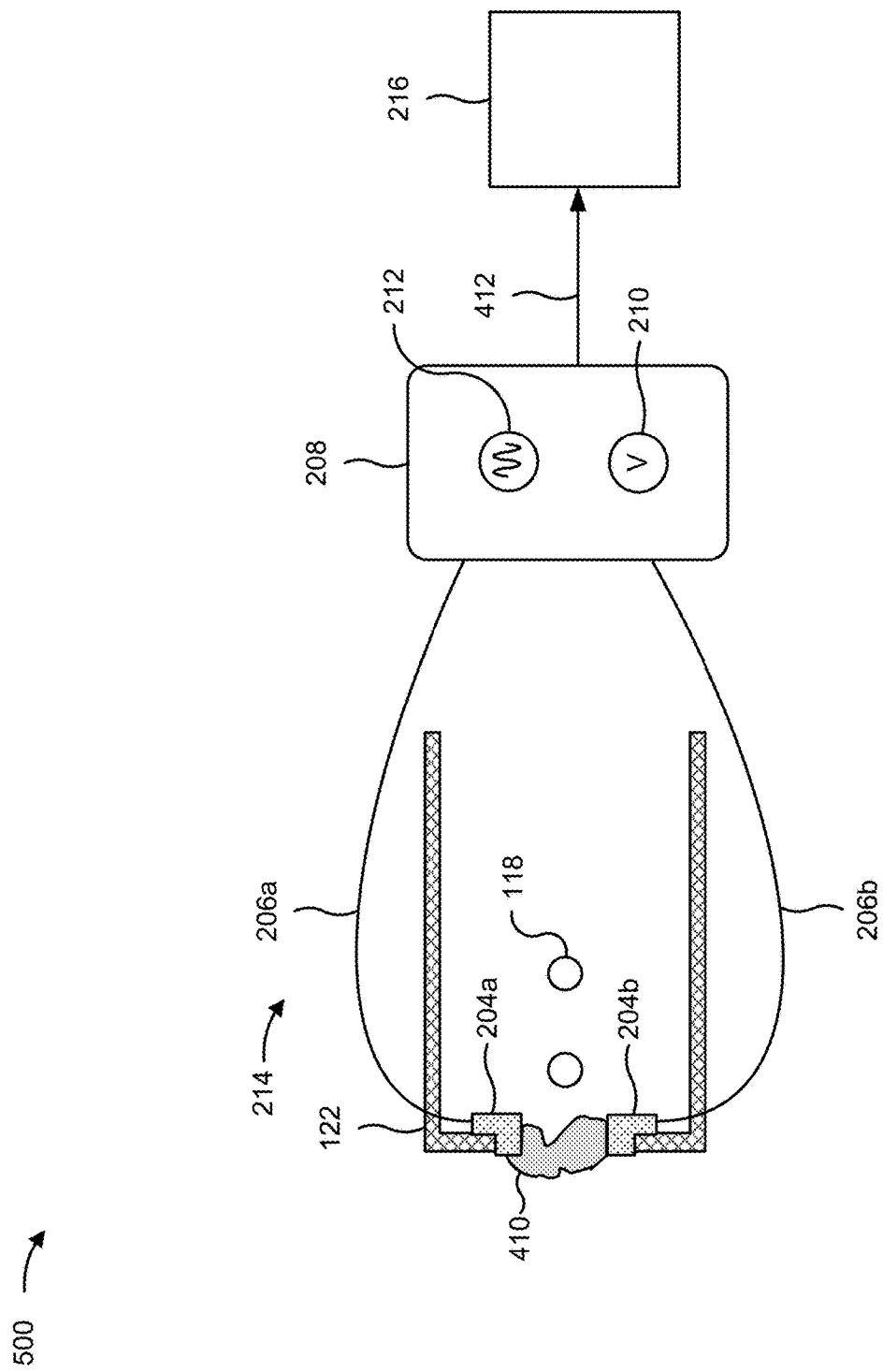

FIGS. 5A-5C are diagrams of example implementations 500 described herein. FIG. 5A shows a cross-section of the DG head 122 ejecting the droplets 118 through the aperture 202 (e.g., ejecting droplets of a target material through the aperture 202 such as Sn droplets, among other examples). As illustrated, the DG head 122 includes a channel 502, an inner surface 504 of the channel 502, and an inner surface 506 of the aperture 202. The channel 502 includes an elongated member through which the droplets 118 are provided to the aperture 202 from a droplet source.

FIG. 5B shows the cross-section of the DG head 122 and the detection circuit 214 (e.g., the electrode elements 204a and 204b, the connectors 206a and 206b, and the signal generator 208 including the load source 210 and the load detector 212). As illustrated, portions of the electrode elements 204a and 204b are mounted to the inner surface 504 of the channel 502, while other portions of the electrode elements 204a and 204b are mounted to the inner surface 506 of the aperture 202. In some implementations, portions of the electrode elements are included on an outer surface of the channel 502 opposing the inner surface 504 and around the aperture 202. In some implementations, portions of the electrode elements may be secured to the inner surfaces 504 and 506 using one or more of a high-temperature epoxy, a lamination technique, a fusion technique, and so on. As a blockage (e.g., the blockage 410) is not present, an output from the load source 210 is blocked from being provided to the load detector 212. Thus, the load detector 212 fails to detect the output, and the detection circuit 214 is in an open-circuit configuration (e.g., corresponding to the open-circuit configuration 304). In such an implementation, and based on the absence of receiving the signal 412 from the signal generator 208, the controller 216 may determine that the blockage 410 has not formed on the aperture 202 (e.g., the blockage 410 is absent from the aperture 202).

In FIG. 5C, the blockage 410 is present, impeding the ejection of the droplets 118 from the DG head 122 and bridging an electrical connection between the electrode element 204a and the electrode element 204b. Furthermore, in FIG. 5C, the detection circuit 214 is in a closed-circuit configuration (e.g., corresponding to the closed-circuit configuration 306). In this implementation, the output from the load source 210 is provided to the load detector 212 via the electrode element 204b, the blockage 410, and the electrode element 204a. As a result, the load detector 212 detects the output from the load source 210.

As shown in FIG. 5C, the detection circuit 214 (e.g., the signal generator 208) transmits the signal 412 indicating the blockage 410 has occurred to the controller 216. In this implementation, and based on receiving the signal 412, the controller 216 determines that the blockage 410 has occurred.

In some implementations, the load detector 212 is coupled to, or includes, an output mechanism of the lithography system 100 (e.g., a visual output such as an indicator light or an audible output such as a buzzer). In such implementations, and in addition to the detection circuit 214 (e.g., the signal generator 208) transmitting the signal 412, the output mechanism of the lithography system 100 may provide, to an operator of the lithography system 100, an indication of the blockage 410. Upon receiving the indication, the operator may notify a maintenance engineer to remove the lithography system 100 from production (e.g., take the lithography system 100 offline) to clean the blockage 410 from the DG head 122.

In some implementations and based on detecting the blockage 410 shown in FIG. 5C, the controller 216 may communicate with the DG head 122 to perform a self-cleaning operation. For instance, and in response to receiving the signal 412, the controller 216 may transmit a signal to the DG head 122 to cause the DG head 122 to perform the self-cleaning operation. In response to receiving the command signal, the DG head 122 (e.g., another controller integrated into the DG head 122) may activate a self-cleaning operation that cleans or removes the blockage 410. Additionally, or alternatively, the controller 216 may provide the signal to cause the DG head 122 to periodically perform self-cleaning operations in accordance with a preventative maintenance schedule, which may reduce the likelihood of occurrence of the blockage 410.

To perform the self-cleaning operation, the DG head 122 may activate a convection, radiation, or conduction heat-transfer mechanism that liquifies or melts the blockage 410. In some implementations, the heat-transfer mechanism may be part of the detection circuitry 214 (e.g., the detection circuitry 214 may include resistors or other components that generate heat). Furthermore, and upon completion of the self-cleaning operation, the DG head 122 (e.g., the other controller integrated into the DG head 122) may transmit, to the controller 216, a signal indicating completion of the self-cleaning operation, and/or a signal including information relevant to a maintenance log file, among other examples.

Additional actions that could be performed using signaling between the DG head 122 and the controller 216 include stopping operations of the lithography system 100 (e.g., exposure operations, pressurization operations, and so on). Furthermore, signaling between the DG head 122 and the controller 216 may cause a real-time notification to an operator or maintenance engineer that results in the lithography system 100 being taken offline to avoid damage to the lithography system 100 or to semiconductor product being fabricated by the lithography system 100.

As indicated above, FIGS. 5A-5C are provided as examples. Other examples may differ from what is described with regard to FIGS. 5A-5C.

Figure 6:
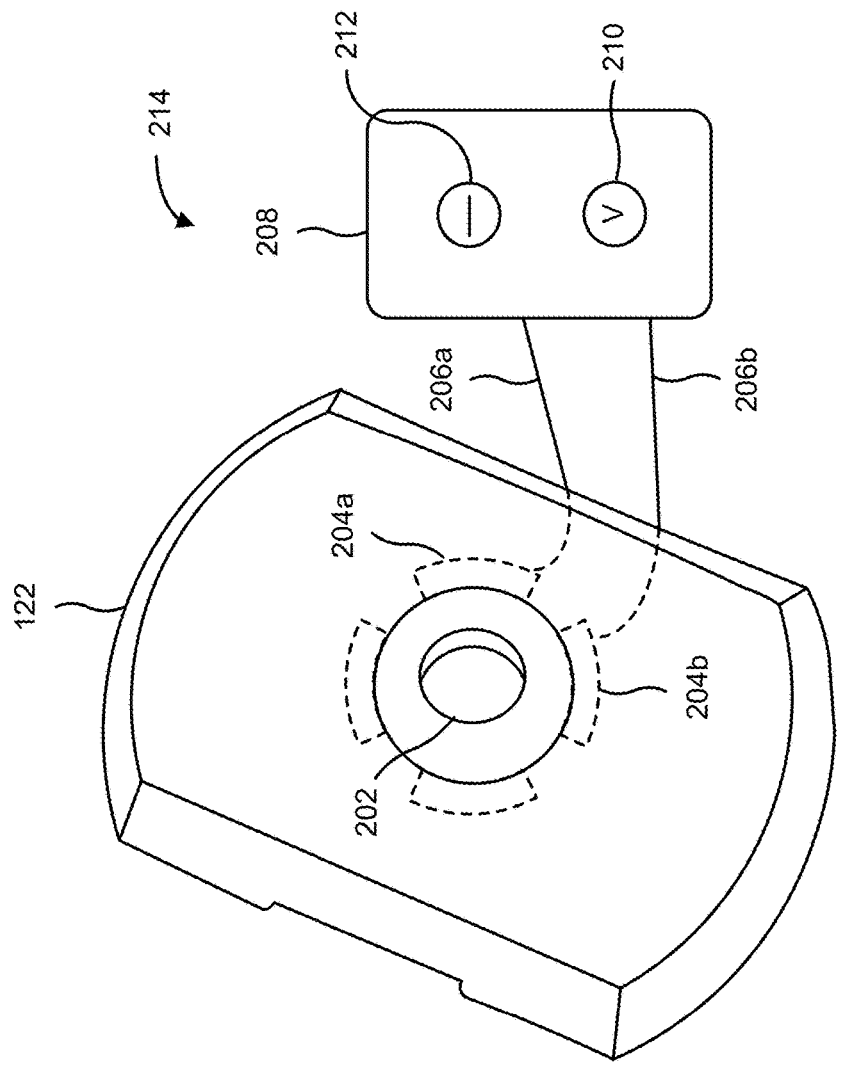
FIG. 6 is a diagram of an example implementation described herein.

FIG. 6 is a diagram of an example implementation 600 described herein. FIG. 6 is an isometric view of the DG head 122, including the aperture 202. FIG. 6 shows elements of the detection circuit 214 (e.g., the electrode elements 204a and 204b, the connectors 206a and 206b, and the signal generator 208 including the load source 210 and the load detector 212). In FIG. 6, the blockage 410 is not present, and the detection circuit 214 is in an open-circuit configuration (e.g., the open-circuit configuration 304). FIG. 6 illustrates the isometric view of the DG head 122, facing a surface of the DG head 122 that faces inwards to a vessel (e.g., the vessel 112).

As indicated above, FIG. 6 is provided as an example. Other examples may differ from what is described with regard to FIG. 6.

Figure 7:
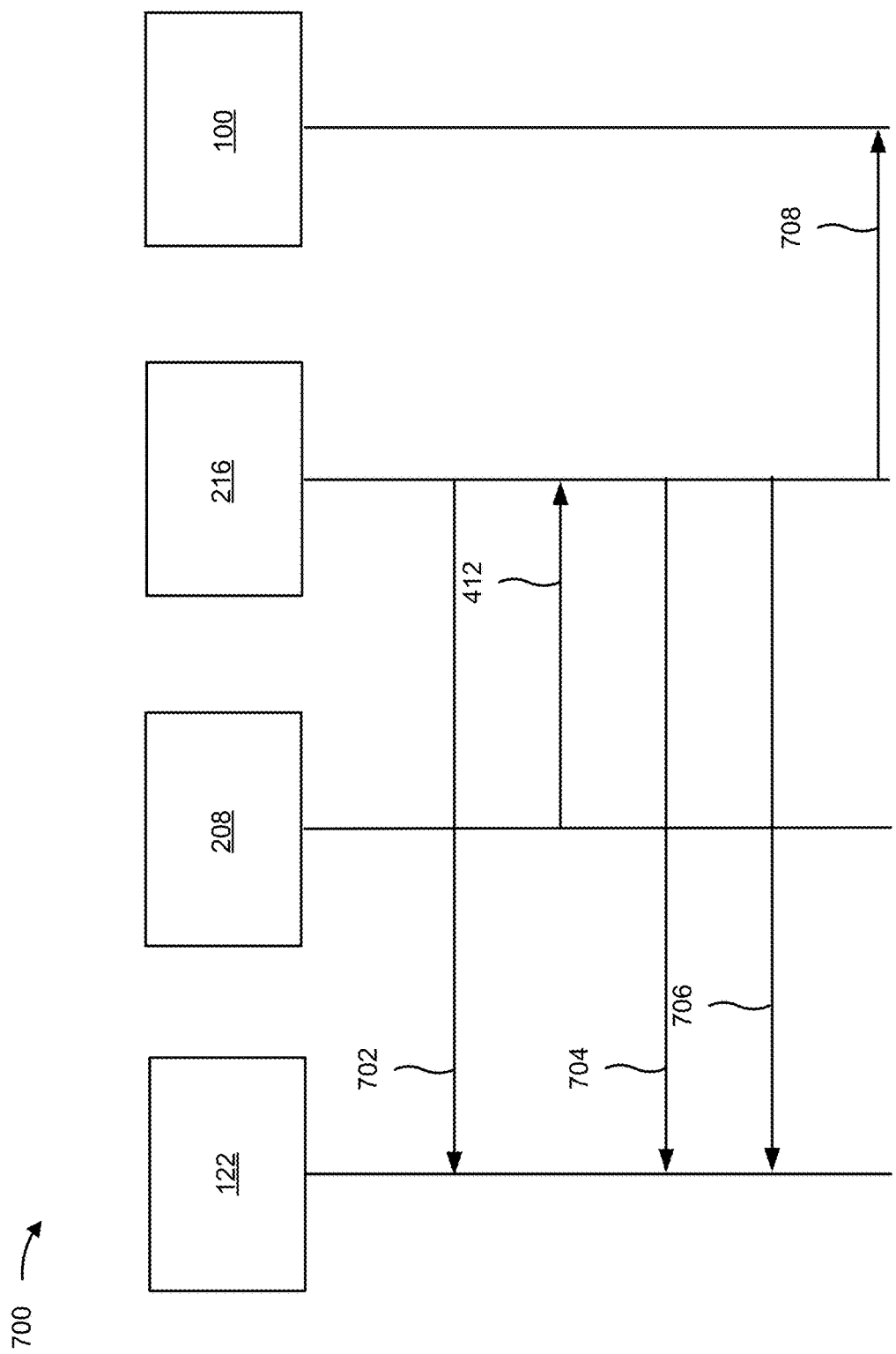
FIG. 7 is a diagram of example signaling flows described herein.

FIG. 7 is a diagram of example signaling flows 700 described herein. The example signaling flows 700 may include information corresponding to commands, instructions, information, or data that is exchanged between the lithography system 100, the DG head 122, the signal generator 208, and/or the controller 216 described above. The sequence or order of the signaling flows 700 shown in FIG. 7 may vary. Furthermore, one or more of the signaling flows 700 may be combinable, omitted, and so on.

FIG. 7 shows a signal 702 that may be transmitted from the controller 216 to the DG head 122 and that causes the DG head 122 to perform a pressurization operation. When blockage 410 is present at the DG head 122, a signal (e.g., the signal 412) may be transmitted from the signal generator 208 to the controller 216 to indicate the blockage 410 at the DG head 122.

Other signaling flows in FIG. 7 include a signal 704 that is transmitted from the controller 216 to the DG head 122. In some implementations, the signal 704 may cause the DG head 122 to stop the pressurization operation caused by the signal 702. A signal 706 may also be transmitted from the controller 216 to the DG head 122 that causes the DG head 122 to perform a self-cleaning operation.

The controller 216 may transmit another signal 708 to the lithography system 100. In some implementations, the signal 708 may include a maintenance log file that includes information associated with the self-cleaning operation mentioned above. In some implementations, the signal 708 may cause the lithography system 100 to output an indication of the blockage 410. In some implementations, the signal 708 may cause the lithography system 100 to terminate an exposure operation.

As indicated above, FIG. 7 is provided as an example. Other examples may differ from what is described with regard to FIG. 7.

Figure 8:
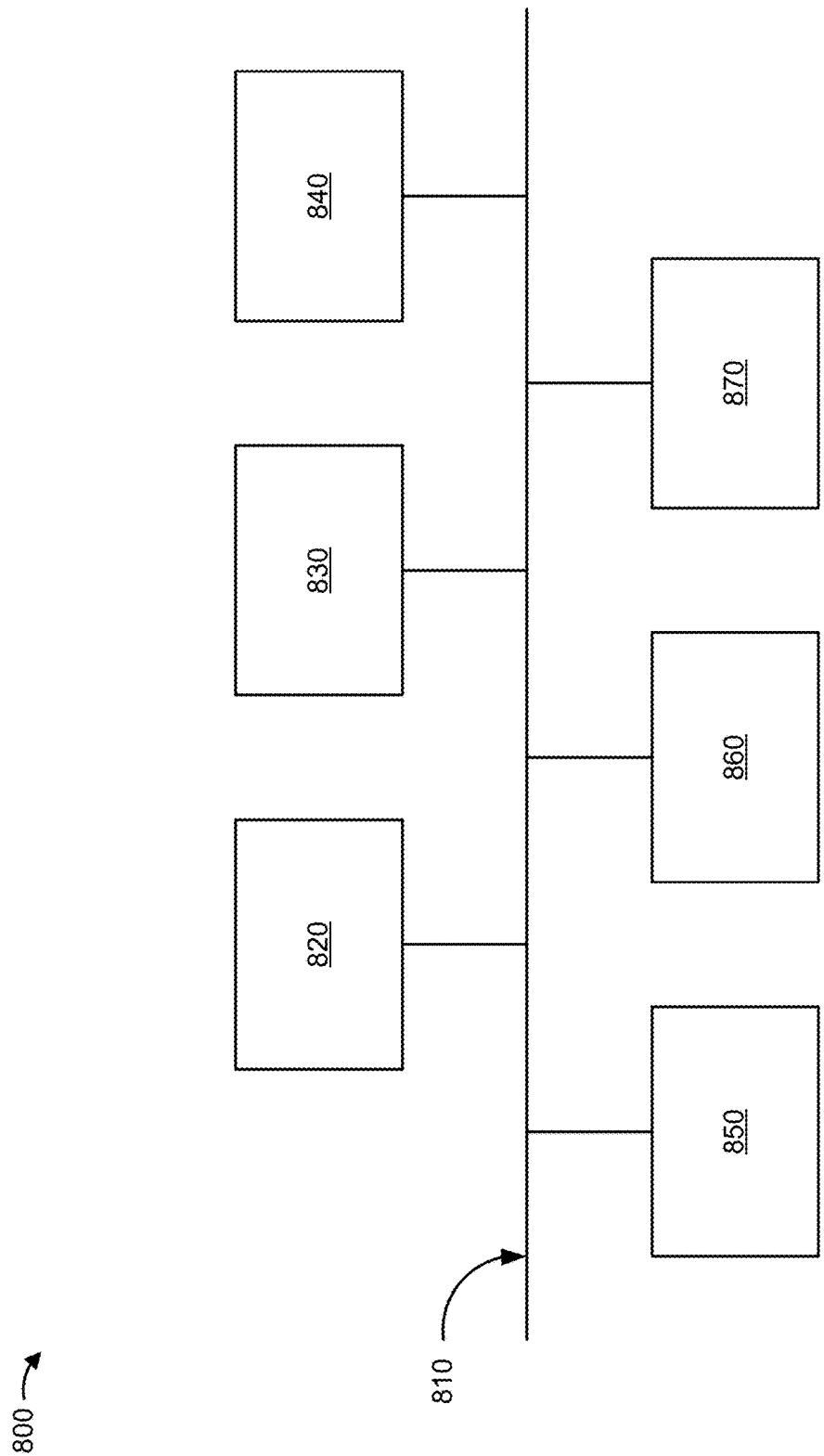
FIG. 8 is a diagram of example components of one or more devices of FIG. 1 described herein.

FIG. 8 is a diagram of example components of a device 800, which may correspond to the lithography system 100, the DG head 122, the signal generator 208, the load detector 212, and/or the controller 216. In some implementations, the lithography system 100, the DG head 122, the signal generator 208, the load detector 212, and/or the controller 216 may include one or more devices 800 and/or one or more components of device 800. As shown in FIG. 8, device 800 may include a bus 810, a processor 820, a memory 830, a storage component 840, an input component 850, an output component 860, and a communication component 870.

Bus 810 includes a component that enables wired and/or wireless communication among the components of device 800. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform a function. Memory 830 includes a random access memory, a read only memory, and/or another type of memory (e.g., a flash memory, a magnetic memory, and/or an optical memory).

Storage component 840 stores information and/or software related to the operation of device 800. For example, storage component 840 may include a hard disk drive, a magnetic disk drive, an optical disk drive, a solid state disk drive, a compact disc, a digital versatile disc, and/or another type of non-transitory computer-readable medium. Input component 850 enables device 800 to receive input, such as user input and/or sensed inputs. For example, input component 850 may include a touch screen, a keyboard, a keypad, a mouse, a button, a microphone, a switch, a sensor, a global positioning system component, an accelerometer, a gyroscope, and/or an actuator. Output component 860 enables device 800 to provide output, such as via a display, a speaker, and/or one or more light-emitting diodes. Communication component 870 enables device 800 to communicate with other devices, such as via a wired connection and/or a wireless connection. For example, communication component 870 may include a receiver, a transmitter, a transceiver, a modem, a network interface card, and/or an antenna.

Device 800 may perform one or more processes described herein. For example, a non-transitory computer-readable medium (e.g., memory 830 and/or storage component 840) may store a set of instructions (e.g., one or more instructions, code, software code, and/or program code) for execution by processor 820. Processor 820 may execute the set of instructions to perform one or more processes described herein. In some implementations, execution of the set of instructions, by one or more processors 820, causes the one or more processors 820 and/or the device 800 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

FIG. 9 is a flowchart of an example process 900 associated with a semiconductor processing tool and methods of operation. In some implementations, one or more process blocks of FIG. 9 may be performed by a controller (e.g., the controller 216). In some implementations, one or more process blocks of FIG. 9 may be performed by another device or a group of devices separate from or including the controller, such as a detection circuit (e.g., the detection circuit 214), a signal generator (e.g., the signal generator 208), and/or processors of a lithography system (e.g., the lithography system 100). Additionally, or alternatively, one or more process blocks of FIG. 9 may be performed by one or more components of device 800, such as processor 820, memory 830, storage component 840, input component 850, output component 860, and/or communication component 870.

As shown in FIG. 9, process 900 may include transmitting, to a DG head of an EUV radiation source, a first signal to cause the DG head to perform a pressurization operation (block 910). For example, the controller 216 may transmit, to a DG head 122 of an EUV radiation source 102, a first signal 702 to cause the DG head 122 to perform a pressurization operation, as described above.

As further shown in FIG. 9, process 900 may include determining that a blockage of an aperture of the DG head has occurred (block 920). For example, the controller 216 may determine that the blockage 410 of an aperture 202 of the DG head 122 has occurred, as described above. In some implementations, the blockage 410 is determined based on a second signal 412 that is received from a detection circuit 214 associated with the DG head 122.

As further shown in FIG. 9, process 900 may include transmitting, based on determining that the blockage has occurred, a third signal to the DG head to cause the DG head to stop the pressurization operation (block 930). For example, the controller 216 may transmit, based on determining that the blockage 410 has occurred, a third signal 704 to the DG head 122 to cause the DG head 122 to stop the pressurization operation, as described above.

Process 900 may include additional implementations, such as any single implementation or any combination of implementations described below and/or in connection with one or more other processes described elsewhere herein.

In a first implementation, the blockage 410 may include an accumulation of a tin (Sn) target material. Determining that the blockage 410 has occurred includes determining that the blockage 410 has occurred based on the blockage 410 electrically connecting respective portions of at least two electrode elements (e.g., electrode elements 204a and 204b).

In a second implementation, alone or in combination with the first implementation, process 900 includes transmitting a fourth signal 706 to the DG head 122 that causes the DG head 122 to perform a self-cleaning operation to remove the blockage 410.

In a third implementation, alone or in combination with one or more of the first and second implementations, process 900 includes transmitting, to a lithography system 100 containing the EUV radiation source 102, a fifth signal 708 including a maintenance log file that includes information associated with the self-cleaning operation.

In a fourth implementation, alone or in combination with one or more of the first through third implementations, the self-cleaning operation includes a heating of the DG head 122 to melt the blockage 410.

In a fifth implementation, alone or in combination with one or more of the first through fourth implementations, process 900 includes transmitting a fourth signal 708, to a lithography system 100 containing the EUV radiation source 102, to cause the lithography system 100 to output an indication of the blockage 410.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

FIG. 10 is a flowchart of an example process 1000 associated with a semiconductor processing tool and methods of operation. In some implementations, one or more process blocks of FIG. 10 may be performed by a controller (e.g., the controller 216). In some implementations, one or more process blocks of FIG. 10 may be performed by another device or a group of devices separate from or including the controller, such as a detection circuit (e.g., the detection circuit 214), a signal generator (e.g., the signal generator 208), and/or processors of a lithography system (e.g., the lithography system 100). Additionally, or alternatively, one or more process blocks of FIG. 10 may be performed by one or more components of device 800, such as processor 820, memory 830, storage component 840, input component 850, output component 860, and/or communication component 870.

As shown in FIG. 10, process 1000 may include determining that a detection circuit of a DG head included in an EUV radiation source is in an open-circuit configuration during an exposure operation performed by a lithography system in which the EUV radiation source is included (block 1010). For example, the controller 216 may determine that a detection circuit 214 of a DG head 122 included in an EUV radiation source 102 is in an open-circuit configuration 304 during an exposure operation performed by a lithography system 100 in which the EUV radiation source 102 is included, as described above.

As further shown in FIG. 10, process 1000 may include determining that the detection circuit has transitioned from the open-circuit configuration to a closed-circuit configuration during the exposure operation (block 1020). For example, the controller 216 may determine that the detection circuit 214 has transitioned from the open-circuit configuration 304 to a closed-circuit configuration 306 during the exposure operation, as described above. In some implementations, a blockage 410, at an aperture 202 of the DG head 122 through which Sn droplets 118 are provided into a vessel 112 of the EUV radiation source 102, closes the detection circuit 214 across a first electrode element 204a and a second electrode element 204b of the detection circuit 214.

As further shown in FIG. 10, process 1000 may include causing the exposure operation to be terminated based on determining that the detection circuit has transitioned from the open-circuit configuration to the closed-circuit configuration during the exposure operation (block 1030). For example, the controller 216 may cause the exposure operation to be terminated based on determining that the detection circuit 214 has transitioned from the open-circuit configuration 304 to the closed-circuit configuration 306 during the exposure operation, as described above.

Process 1000 may include additional implementations, such as any single implementation or any combination of implementations described below and/or in connection with one or more other processes described elsewhere herein.

In a first implementation, the blockage 410 corresponds to an Sn target material that electrically connects a load source 210 to a load detector 212 in the closed-circuit configuration 306 of the detection circuit 214, wherein the load source 210 being electrically connected to the load detector 212 causes a signal generator 208 to generate a signal 412, and wherein determining that the detection circuit 214 has transitioned from the open-circuit configuration 304 to the closed-circuit configuration 306 includes receiving the signal 412 from the signal generator 208.

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

Using a detection circuit, a blockage (e.g., a build-up, clogging) on the DG head can be quickly identified and resolved, which reduces troubleshooting time and reduces downtime of the EUV exposure tool. This increases the productivity of the EUV exposure tool and increases semiconductor processing yield and throughput of the EUV exposure tool.

As described in greater detail above, some implementations described herein provide a method. The method includes transmitting, by a controller of an EUV radiation source and to a DG head of the EUV radiation source, a first signal to cause the DG head to perform a pressurization operation. The method includes determining, by the controller during the pressurization operation, that a blockage of an aperture of the DG head has occurred, where the blockage is determined based on a second signal that is received from a detection circuit associated with the DG head. The method includes transmitting, by the controller and based on determining that the blockage has occurred, a third signal to the DG head to cause the DG head to stop the pressurization operation.

As described in greater detail above, some implementations described herein provide a method. The method includes determining, by a controller of an EUV radiation source, that a detection circuit of a DG head included in the EUV radiation source is in an open-circuit configuration during an exposure operation performed by a lithography system in which the EUV radiation source is included. The method includes determining, by the controller, that the detection circuit has transitioned from the open-circuit configuration to a closed-circuit configuration during the exposure operation, where a blockage, at an aperture of the DG head through which droplets of a target material are provided into a vessel of the EUV radiation source, closes the detection circuit across a first electrode element and a second electrode element of the detection circuit. The method includes causing, by the controller, the exposure operation to be terminated based on determining that the detection circuit has transitioned from the open-circuit configuration to the closed-circuit configuration during the exposure operation.

As described in greater detail above, some implementations described herein provide an EUV radiation source. The EUV radiation source includes a vessel and a droplet generator head including an aperture through which droplets of a target material are ejected into the vessel. The EUV radiation source also includes a detection circuit comprising a plurality of electrode elements around a perimeter of the aperture, and a signal generator configured to generate a signal when a conductive path is formed between two or more of the plurality of electrode elements, where the signal is generated to indicate that a blockage of at least a portion of the aperture has occurred.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    transmitting, by a controller of an extreme ultraviolet (EUV) radiation source to a droplet generator (DG) head of the EUV radiation source, a first signal to cause the DG head to perform a pressurization operation;
    determining, by the controller during the pressurization operation, that a blockage of an aperture of the DG head has occurred based on the blockage electrically connecting respective portions of at least two electrode elements,
        wherein the blockage is determined based on a second signal that is received from a detection circuit associated with the DG head; and
    transmitting, by the controller, a third signal to the DG head to cause the DG head to stop the pressurization operation,
        wherein transmitting the third signal is based on determining that the blockage of the aperture of the DG head has occurred.

2. The method of claim 1, wherein the blockage includes an accumulation of a tin (Sn) target material.

3. The method of claim 1, further comprising:
    transmitting a fourth signal to the DG head that causes the DG head to perform a self-cleaning operation to remove the blockage.

4. The method of claim 3, further comprising:
    transmitting, to a lithography system containing the EUV radiation source, a fifth signal including a maintenance log file that includes information associated with the self-cleaning operation.

5. The method of claim 3, wherein the self-cleaning operation includes a heating of the DG head to melt the blockage.

6. The method of claim 1, further comprising:
    transmitting a fourth signal, to a lithography system containing the EUV radiation source, to cause the lithography system to output an indication of the blockage.

7. A method, comprising:
    determining, by a controller of an extreme ultraviolet (EUV) radiation source, that a detection circuit of a droplet generator (DG) head included in the EUV radiation source is in an open-circuit configuration during an exposure operation performed by a lithography system in which the EUV radiation source is included;
    determining, by the controller, that the detection circuit has transitioned from the open-circuit configuration to a closed-circuit configuration during the exposure operation,
        wherein a blockage, at an aperture of the DG head through which droplets of a target material are provided into a vessel of the EUV radiation source, closes the detection circuit across a first electrode element and a second electrode element of the detection circuit; and
    causing, by the controller, the exposure operation to be terminated based on determining that the detection circuit has transitioned from the open-circuit configuration to the closed-circuit configuration during the exposure operation.

8. The method of claim 7, wherein the blockage includes an accumulation of a tin (Sn) target material that electrically connects a load source to a load detector in the closed-circuit configuration of the detection circuit;
    wherein the load source being electrically connected to the load detector causes a signal generator to generate a signal; and
    wherein determining that the detection circuit has transitioned from the open-circuit configuration to the closed-circuit configuration comprises:
        receiving the signal from the signal generator.

9. An extreme ultraviolet (EUV) radiation source, comprising:
    a vessel;

a droplet generator (DG) head including an aperture through which droplets of a target material are ejected into the vessel; and a detection circuit comprising:
a plurality of electrode elements around a perimeter of the aperture; and
a signal generator configured to generate a signal when a conductive path is formed between two or more of the plurality of electrode elements,
wherein the signal is generated to indicate that a blockage of at least a portion of the aperture has occurred.

10. The EUV radiation source of claim 9, wherein ends of the plurality of electrode elements are separated by regions that electrically isolate respective pairs of the plurality of electrode elements;
wherein the conductive path bridges at least one region between two or more of the plurality of electrode elements to electrically connect the two or more of the plurality of electrode elements;
wherein the two or more of the plurality of electrode elements being electrically connected causes the detection circuit to be closed; and
wherein the signal generator is configured to generate the signal based on the detection circuit being closed.

11. The EUV radiation source of claim 9, wherein at least one of the plurality of electrode elements includes a metal film material.

12. The EUV radiation source of claim 9, wherein portions of the plurality of electrode elements are mounted to an inner surface of a channel of the DG head.

13. The EUV radiation source of claim 12, wherein other portions of the plurality of electrode elements are mounted to an inner surface of the aperture.

14. The EUV radiation source of claim 9, wherein a diameter between a first electrode element and a second electrode element of the plurality of electrode elements, across the aperture of the DG head, is in a range of approximately 5 millimeters to approximately 7 millimeters.

15. The EUV radiation source of claim 9, wherein the plurality of electrode elements includes a quantity of two to eight electrode elements.

16. The EUV radiation source of claim 9, wherein a length of at least one of the plurality of electrode elements is in a range of approximately 1 millimeter to approximately 5 millimeters.

17. The EUV radiation source of claim 9, wherein a length of a region defining a gap between respective adjacent ends of at least two of the plurality of electrode elements is in a range of approximately 1 millimeter to approximately 5 millimeters.

18. The EUV radiation source of claim 9, wherein the signal generator is further configured to communicate the signal to a controller associated with the DG head using a communication link.

19. The EUV radiation source of claim 18, wherein the target material includes a tin (Sn) material.

20. The EUV radiation source of claim 9, wherein a shape of at least one of the plurality of electrode elements conforms to a shape of the aperture.

* * * * *